United States Patent [19]

Sheldon et al.

[11] 4,208,632
[45] Jun. 17, 1980

[54] RADAR RECEIVER

[75] Inventors: Edward J. Sheldon, Lexington;
William C. Brown, Jr., Littleton;
Thomas D. Shovlin, Arlington;
Ronald A. Wagner, Hudson, all of Mass.

[73] Assignee: Raytheon Company, Lexington, Mass.

[21] Appl. No.: 921,628

[22] Filed: Jun. 30, 1978

[51] Int. Cl.² .......................... G01S 7/30; H03K 5/20
[52] U.S. Cl. ..................................... 328/117; 343/7 A
[58] Field of Search ........... 343/7 AG, 7 A; 307/355, 307/357, 358; 328/116, 117

[56] References Cited

U.S. PATENT DOCUMENTS

| | | | |
|---|---|---|---|
| 2,784,400 | 3/1957 | Ehrenfried | 343/7 AG X |
| 3,149,333 | 9/1964 | Campbell | 343/7 AG X |
| 3,267,375 | 8/1966 | Olsen | 328/116 X |
| 3,495,244 | 2/1970 | La Rosa | 343/7 AG X |
| 3,544,983 | 12/1970 | Wallace, Jr. et al. | 328/116 X |
| 3,602,826 | 8/1971 | List et al. | 328/117 |
| 3,875,391 | 4/1975 | Shapiro et al. | 235/156 |
| 4,037,163 | 7/1977 | Nicholas | 343/7 AG X |
| 4,037,202 | 7/1977 | Terzian | 364/200 |
| 4,079,376 | 3/1978 | Kirk, Jr. | 343/7 AG X |
| 4,127,813 | 11/1978 | Hiroshima et al. | 307/355 X |

Primary Examiner—Malcolm F. Hubler
Attorney, Agent, or Firm—Philip J. McFarland; Joseph D. Pannone

[57] ABSTRACT

An improved radar receiver is shown to include a plurality of intermediate frequency and video frequency amplifiers, each one of such amplifiers being arranged to process received signals within a different range of amplitudes so that the overall dynamic range of such receiver may be equivalent to the dynamic range of a conventional radar receiver with automatic gain control.

5 Claims, 12 Drawing Figures

FIG. 4A CLOCK PULSES

FIG. 4B RESET COMMAND

FIG. 4C RIPPLE CARRY OUTPUT (COUNTER 101, FIG.3)

FIG. 4D INVERTED CLOCK PULSES

FIG. 4E LATCH COMMAND

FIG. 4F START CONVERT COMMAND

FIG. 4G Q, F/F 107

FIG. 4H $\overline{Q}$, F/F 109

RADAR RECEIVER

BACKGROUND OF THE INVENTION

This invention pertains generally to pulse Doppler radar receivers and more particularly to a receiver intended for use with a Fast Fourier Transform (FFT) processor without any need for automatic gain control.

As is known in the art, conventional pulse Doppler radar receivers, especially those intended for use in missile seekers, employ automatic gain control (AGC) loops for controlling the gain of such receivers in order to respond to the wide dynamic range of input signals that can result from electronic countermeasures (ECM), clutter, and multiple target environments. In such receivers input signals are successively passed through a bank of roughing filters (centered on the target Doppler frequency), an intermediate frequency (IF) amplifier strip with a so-called fast automatic gain control (AGC) loop and an analog-to-digital (A/D) converter with a limited dynamic range. If the AGC loop close-out frequency is greater than the bandwidth of the roughing filters, the AGC loop will effectively normalize all signal level variations existing at the output of the roughing filters.

Although a receiver with a fast AGC loop is effective in an ECM environment, a slow AGC loop is better suited for operation when a number of targets are present or a target is in clutter. In such situations and simultaneous presence of more than one target line in the roughing filter bandwidth will appear to a fast AGC loop as a signal level variation, and the AGC loop will respond to suppress the apparent signal level variations. Such action will result in crossmodulation distortion, causing signal spreading losses and creating false target lines. The net effect is often a loss of target track. On the other hand, although a slow AGC loop following the roughing filters is desirable to handle the multiple target and the target in clutter situations, a slow AGC loop is vulnerable to saturation and excessive recovery time problems imposed by most ECM threats.

From the foregoing it would appear that the optimum approach would be to employ a receiver without AGC but with a dynamic range wide enough to avoid saturation under any operating conditions.

SUMMARY OF THE INVENTION

With this background of the invention in mind, it is therefore an object of this invention to provide a pulse Doppler receiver without a conventional AGC loop.

Another object of this invention is to provide, in a receiver such as is contemplated, means for processing input signals within an extremely wide instantaneous dynamic range without saturation being experienced.

These and other objects of the invention are attained generally by providing, in a pulse Doppler receiver, an interface unit wherein each one of the signals from the roughing filters is first down-converted to baseband video signals and then is divided and amplitude weighted to produce four separate baseband video signals differing by 18 dB in magnitude to provide a total of 102 dB of dynamic range. Each of the four separate baseband video signals is sampled simultaneously in a set of four identical sample/hold circuits. A window comparator and a control logic network are provided to determine and select the sample/hold circuit containing the largest sample value which is less than full scale. The comparator/logic network passes the selected sample, via an 8 bit A/D converter, to an FFT signal processor along with a 2 bit exponent word to allow the selected sample to be appropriately scaled within the processor.

BRIEF DESCRIPTION OF THE DRAWINGS

Other objects and many of the attendant advantages of this invention will be readily appreciated as the same becomes better understood by reference to the following detailed description when considered in connection with the accompanying drawings wherein.

DESCRIPTION OF THE PREFERRED EMBODIMENT

Figure 1:
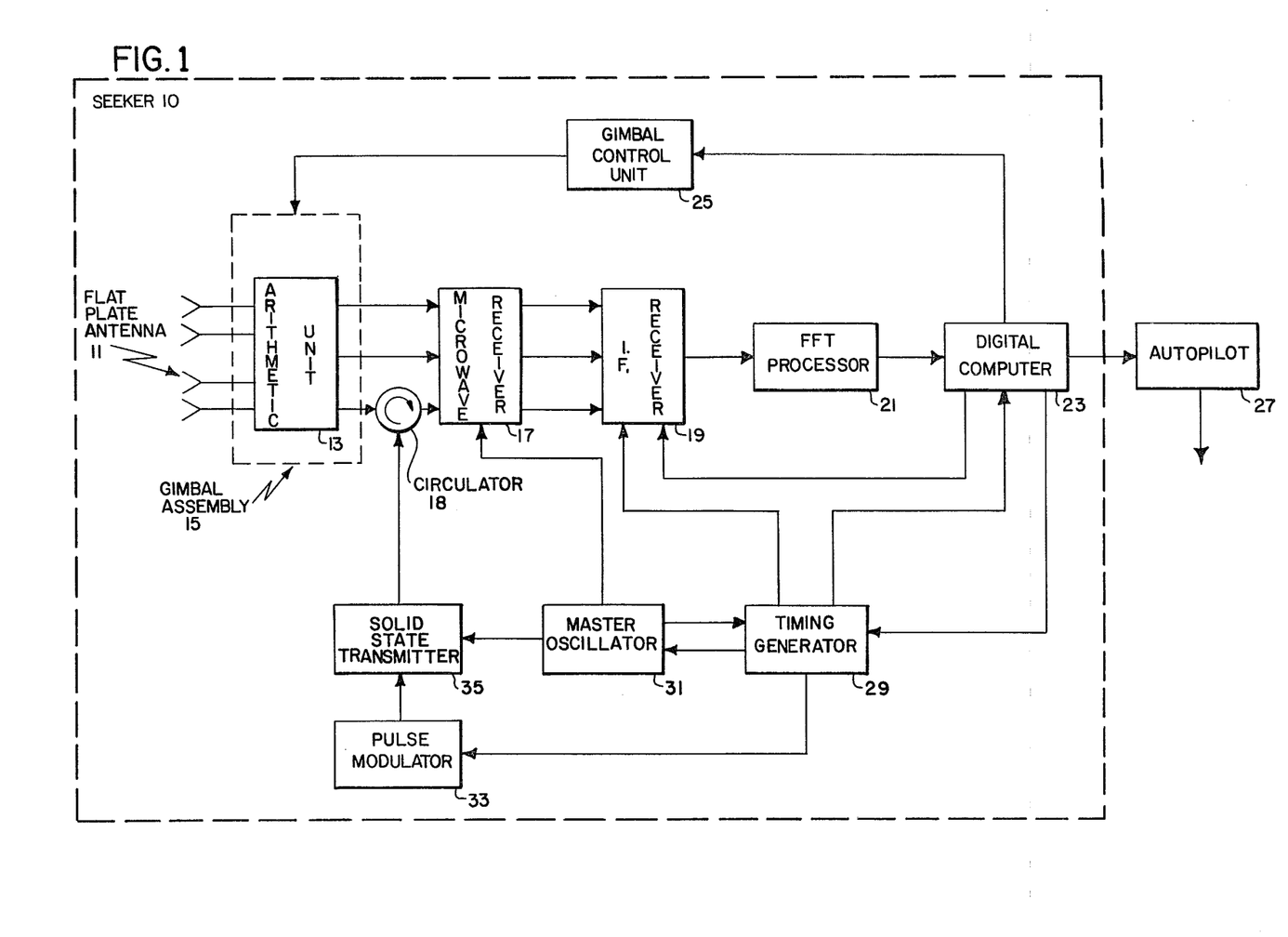
FIG. 1 is a simplified block diagram of an active seeker for a guided missile, such seeker incorporating a pulse Doppler receiver according to this invention.

Referring now to FIG. 1, an active radar seeker 10 is shown to include a flat plate antenna 11 and a monopulse arithmetic unit 13, both of which are mounted on gimbal assembly 15. Monopulse pitch and yaw error signals developed within the monopulse arithmetic unit 13 are passed, via rotary joints (not shown), directly to a microwave receiver 17 while the monopulse sum signal is passed to the microwave receiver 17 via a rotary joint (not shown) and a circulator 18. The microwave receiver 17 is here of conventional design and is effective to provide both preamplification and down-conversion of the monopulse sum signal along with the monopulse pitch and yaw signals to a first I.F. of, say, 300 MHz. Such I.F. signals are passed to an I.F. receiver 19 which will be described in greater detail hereinbelow; suffice it to say here that that receiver is effective to provide Doppler filtering, range-gating and A/D conversion of the monopulse sum and pitch and yaw error signals as well as a split gate range error signal. The monopulse signals and the range error signal from the I.F. receiver 19 are passed to a Fast Fourier Transform, FFT processor 21. That processor may, for example, be similar to the one described in Shapiro et al, U.S. Pat. No. 3,875,391 issued Apr. 1, 1975 and assigned to the same assignee as the present application. The FFT signal processor 21 operates in a known manner to analyze signals indicative of the Doppler frequency of any detected targets. The output signals from the FFT processor 21 are applied to a digital computer 23. Such computer may, for example, be similar to the one shown in U.S. Pat. No. 4,037,202, inventor John Terzian, issued July 19, 1977 and assigned to the same assignee as the present application. The digital computer 23 then is effective to produce appropriate command signals for a gimbal control unit 25, an autopilot 27, a timing generator 29 and the I.F. receiver 19. The first two of the just-named elements are conventional and are effective, respectively, to position the gimbal assembly 15 and to develop control signals for the missile control surfaces (not shown) as required. The timing generator 29 is operative, inter alia, to provide clock signals to the digital computer 23 as well as range gate control and clock signals to the I.F. receiver 19. It is noted here in passing that the tracking loops are closed through the FFT signal processor 21 and the digital computer 23. Thus, the digital computer 23 provides a control signal to the I.F. receiver 19 for tuning a voltage-controlled oscillator, as will be described in detail hereinbelow.

A master oscillator 31, a pulse modulator 33 and a solid state transmitter 35 complete the seeker 10. The first two of the just-named elements are conventional and are effective, respectively, to provide an X-band carrier wave (C.W.) signal and trigger pulses to the solid state transmitter 35. The latter may, for example, be similar to the one shown in application Ser. No. 814,743, Inventor George Jerinic, filed June 30, 1977 and assigned to the same assignee as the present application.

Figure 2A:
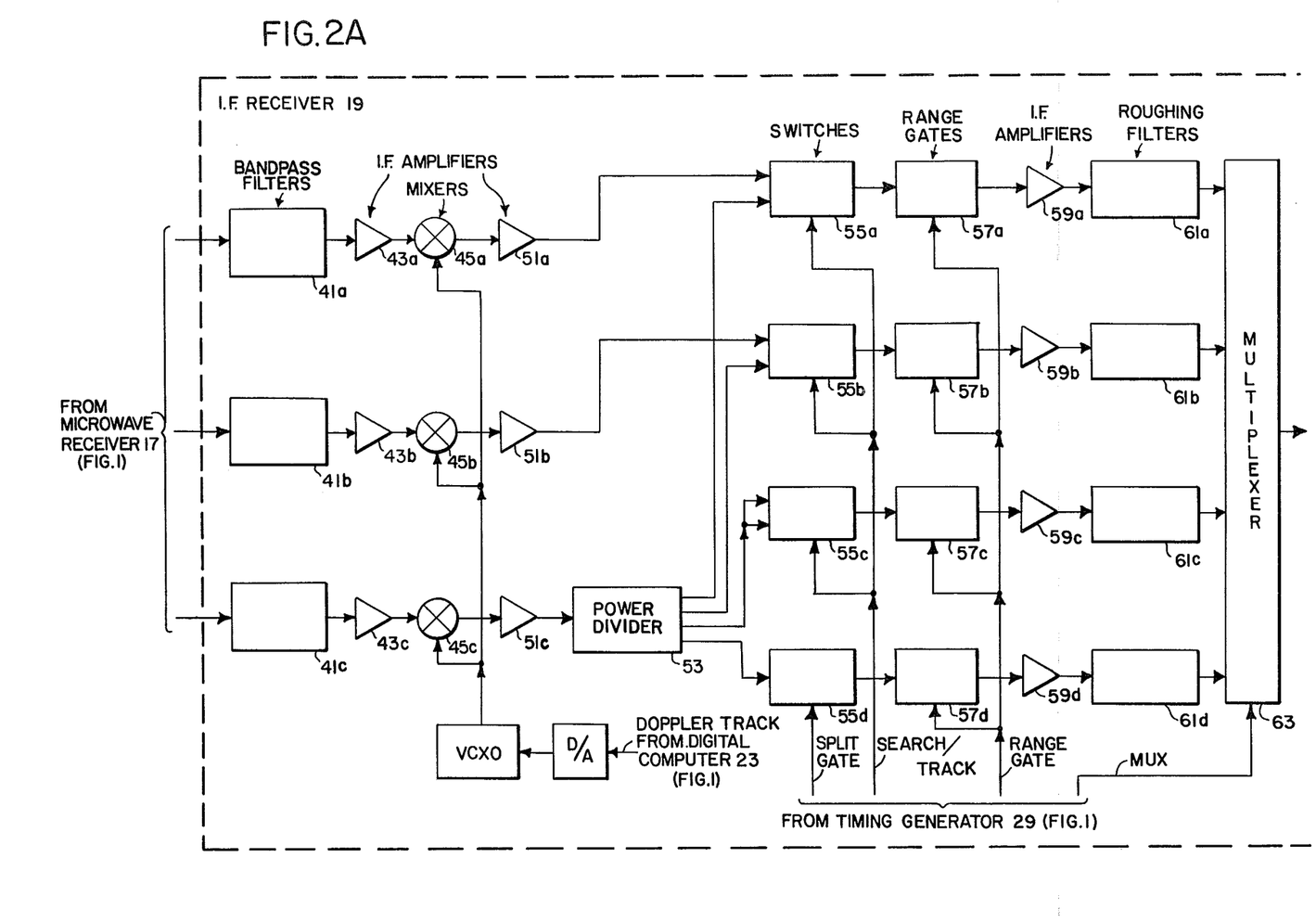
FIGS. 2A and 2B, taken together, constitute a simplified block diagram of an IF receiver section for the pulse Doppler receiver of FIG. 1, such diagram also showing how baseband video signals are processed according to the invention.
Figure 2B:
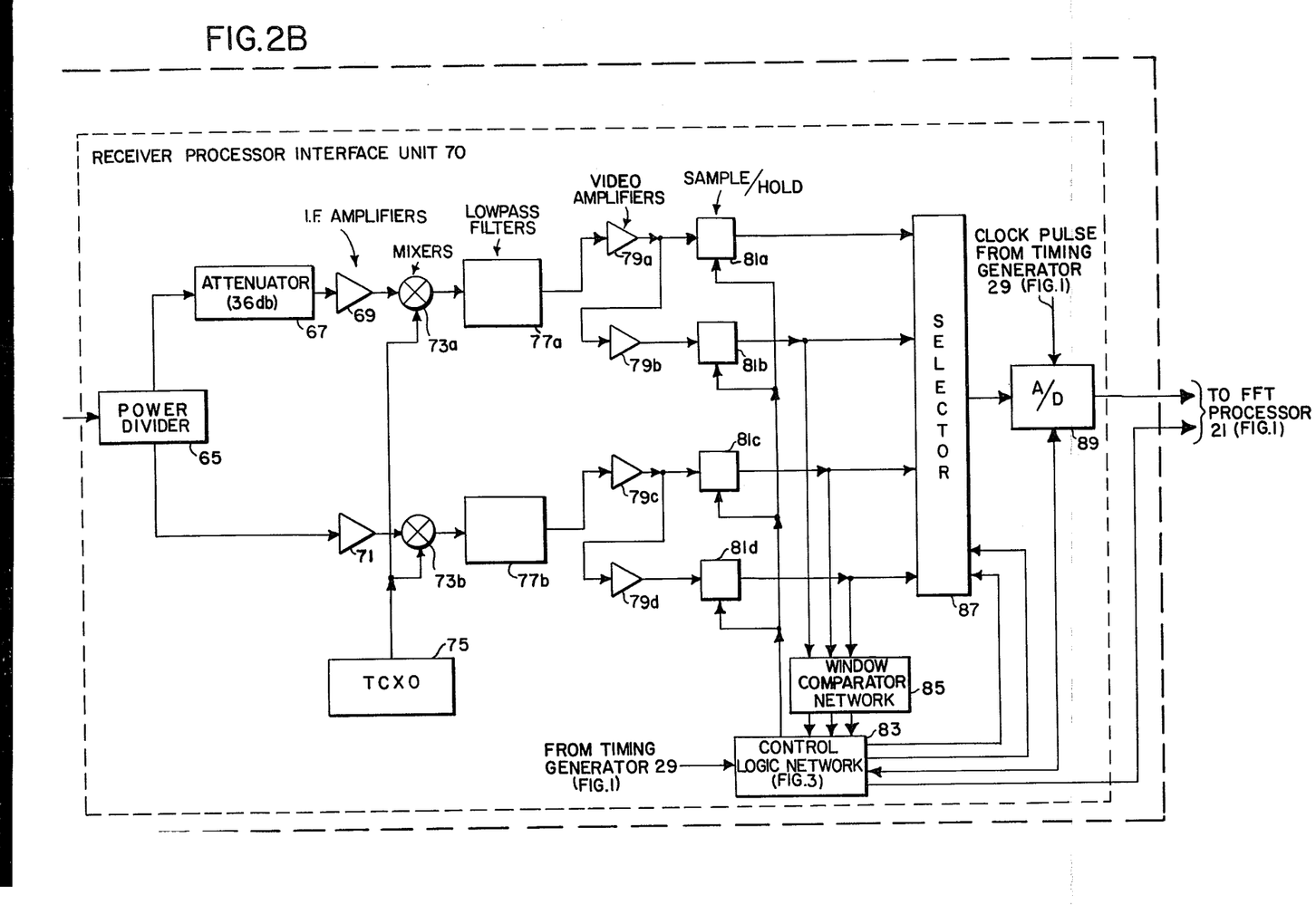

Referring now to the details of the I.F. receiver 19 in FIGS. 2A and 2B, the various monopulse signals are passed, as shown, through bandpass filters 41a, 41b and 41c wherein "out of band" signals are rejected. The resulting filtered signals are passed, via I.F. amplifiers 43a, 43b and 43c to mixers 45a, 45b and 45c wherein they are downconverted to a second I.F. frequency of, say 30 MHz. The reference signals to the latter are obtained from a voltage-controlled crystal oscillator VCXO 47, which is tuned by a DOPPLER TRACK control signal from the digital computer 23 (FIG. 1) passed through a digital-to-analog (D/A) converter 49. It will be appreciated that the DOPPLER TRACK control signal is effective to adjust the frequency of the VCXO 47 so that the signals out of mixers 45a, 45b and 45c will be centered in the passband (here 16 KHz wide) of roughing filters 61a, 61b, 61c and 63d.

The 30 MHz I.F. signals from mixers 45a, 45b and 45c are amplified in I.F. amplifiers 51a, 51b and 51c. The I.F. signal from I.F. amplifier 51c, which here corresponds to the monopulse sum channel signal, is passed to a power divider 53 wherein it is split into four equal I.F. signals applied as shown to switches 55a, 55b, 55c and 55d. The monopulse pitch and yaw error signals are also applied, respectively, to switches 55a and 55b. The latter, along with switch 55c, are controlled by a SEARCH/TRACK control signal from the timing generator 29 (FIG. 1) and are effective to gate the sum channel signal through in the SEARCH mode and the pitch and yaw error signals through in the TRACK mode. Switch 55c is provided for phase and amplitude matching purposes, while switch 55d is included to provide a split gate range tracking loop controlled by a control signal labeled SG from the digital computer 23 (FIG. 1) via the timing generator 29 (FIG. 1). It is noted here that switch 55d is actually a 0/180 degree phase shifter used to bi-phase modulate the sum channel signal to provide a split gate range tracking signal. The I.F. signals from switches 55a, 55b, 55c and 55d are passed, via range gates 57a, 57b, 57d and I.F. amplifiers 59a, 59b, 59c and 59d, to roughing filters 61a, 61b, 61c and 61d. the latter, as noted above, have a bandwidth of 16 KHz to reject all undesired signals outside the Doppler spectrum of the target. The I.F. signals from the roughing filters 61a, 61b, 61c and 61d are applied to an I.F. multiplexer 63 wherein they are time-multiplexed into a single channel in response to command signals (labeled MUX) from the timing generator 29 (FIG. 1). The multiplexed I.F. signals from the multiplexer 63 are passed to a power divider 65 which divides such signals into two channels (not numbered) which are offset in gain by 36 dB. Thus, a 36 dB attenuator 67 and an I.F. amplifier 69 with a gain of 36 dB are provided in a first one of the channels, while a second one of the channels has only an I.F. amplifier 71 having a gain of 36 dB. It is noted here in passing that the 36 dB attenuator 67 and the 36 dB gain I.F. amplifier 69 are included in the first one of the channels to provide for phase tracking between the two channels. The 36 dB attenuator 67 is included in a first one of such channels to provide a 36 dB offset between the two channels. That is to say, to achieve phase tracking between the two channels over a range of temperatures, identical I.F. amplifiers 69, 71 must be provided in each of such channels. The 36 dB attenuator 67 is included in a first one of such channels to provide a 36 dB offset between the two channels. The I.F. signals from I.F. amplifiers 69, 71 are passed to a pair of mixers 73a, 73b wheren they are down-converted to offset baseband video signals by being heterodyned with a reference signal supplied by a temperature compensated crystal oscillator (TCXO 75). The video signals from the mixers 73a, and 73b are applied to a pair of video amplifiers 77a, 77b which here serve as low pass filters to reject undesired mixer products and broadband noise and are sometimes referred to as low pass filters.

Digressing now for a moment, it will be appreciated by those of skill in the art that means for accommodating signals within a wide dynamic range without distortion must be provided in lieu of a conventional AGC arrangement. Thus, the time-multiplexed I.F. signals from the roughing filters 61a, 61b, 61c and 61d are passed through four separate amplifier channels which differ only in that each has a gain to accommodate signals whose amplitude lies in a different portion of the dynamic range of possible signals. Here, each amplifier channel covers an eight bit dynamic range with five bit overlap between successive channels for a total dynamic range of seventeen bits or 102 dB. It is noted here in passing that the four amplifier channels are implemented partially at an intermediate frequency and partially at a video frequency to improve the noise figure and to meet phase and amplitude tracking requirements. That is to say, the four amplifier channels cannot be efficiently implemented at an intermediate frequency because of the difficulty involved in there obtaining gain and phase tracking between amplifier channels and the four amplifier channels cannot be efficiently implemented at a video frequency because of the higher noise figures of components at such a frequency than are experienced with components used at an intermediate frequency. Additionally, it should be noted that, if several stages of IF preamplification were to be employed so that the noise figures of the components at a video frequency would be of little import, the portions of the four amplifier channels at a video frequency would have to be operated at excessively high voltage levels to cover the possible dynamic range.

With the foregoing in mind, it may be seen that the filtered signals from the low pass filter 77a are applied, via a video amplifier 79a with 18 dB gain, to a sample/-hold circuit (S/H 81a). Such filtered signals are also applied, via the video amplifier 79a and a video amplifier 79b (which also has 18 dB gain) to a S/H 81b. Correspondingly, the filtered signals from the low pass filter 77b are applied as shown to S/H 81c and S/H 81d. Video amplifiers 79c, 79d in the paths to S/H 81c, 81d have 18 dB gains. Each one of the amplifier channels here has an overall dynamic range of approximately 48 dB. It follows then that, so long as the amplitude of an I.F. signal into the four amplifier channels is above the level of noise and below the highest level which may be linearly amplified in the amplifier channel with the lowest gain, such signal will be linearly amplifier (and converted to a corresponding baseband video signal) in one of the four amplifier channels. Further, if the amplitude of an I.F. signal into the four amplifier channels is higher than the level which may be linearly amplified by the amplifier channel with the lowest gain, some nonlinearity in amplification of such an I.F. signal may occur. Overall, then, the dynamic range of the four amplifier channels taken together may be deemed here to be 102 dB even though no automatic gain control is utilized and the individual amplifier channels are implemented with conventional elements. Such a range is, of course, adequate in any practical situation.

It will be recognized that the amplitude of an I.F. signal into the four amplifier channels will vary with operational conditions (such as range to a target being tracked or whether a multiple target situation exists) and the particular monopulse or range signal being processed at any instant in time. It is necessary, therefore, that means be supplied to automatically select the particular one of the S/H 81a, 81b, 81c, 81d which contains the proper signal for further processing. To accomplish such selection, an arrangement is provided which repetitively senses the level of the signal in each S/H 81a, 81b, 81c, 81d and, if the levels of the signals in the latter three exceed predetermined levels, selects S/H 81a or, if the level of the signal in at least one of the S/H 81b, 81c, 81d is indicative of a target, selects the S/H containing the largest signal which also is less than the predetermined level. Thus, the S/H 81b 81c, 81d are connected to a window comparator network 85. That network is made up here of three conventional comparators (not shown) wherein the level of the signals in S/H 81b, 81c, 81d are compared with appropriate DC levels. It is noted here in passing that the output of S/H 81a is not applied to the comparator network 85 as this corresponds to the least sensitive (lowest gain) channel and this channel is chosen only if S/H 81b, 81c and 81d are at full scale. The control logic network 83 actuates a selector 87 to allow a selected sample from the S/H 81a, 81b, 81c or 81d to be passed to an A/D converter 89 (of eight bits). A 2 bit exponent word is also passed directly from the control logic network 83 to the FFT processor 21 (FIG. 1). The A/D converter 89 then is operative to pass, in the form of a digital word with a sign bit plus seven resolution bits, the selected sample to the FFT processor (FIG. 1). The operating points and dynamic ranges of the four just described amplifier channels are such that the digital word out of A/D 89 and the 2 bit exponent word uniquely describe the amplitude of the I.F. signal into the four amplifier channels even though such signal may vary in amplitude by 102 dB.

Figure 3:
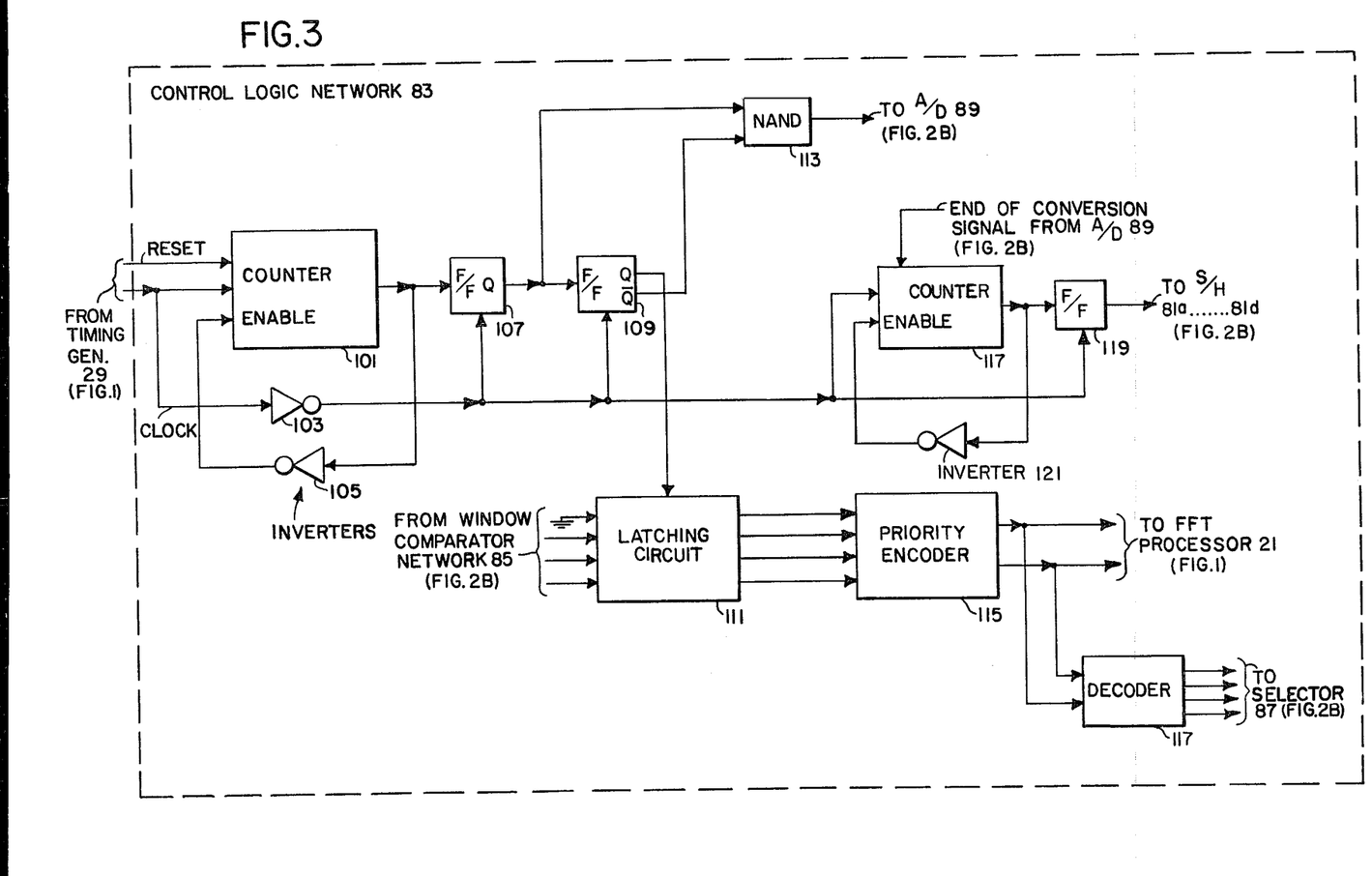
FIG. 3 is a simplified block diagram of the control logic network shown in FIG. 2B.
Figure 4A:
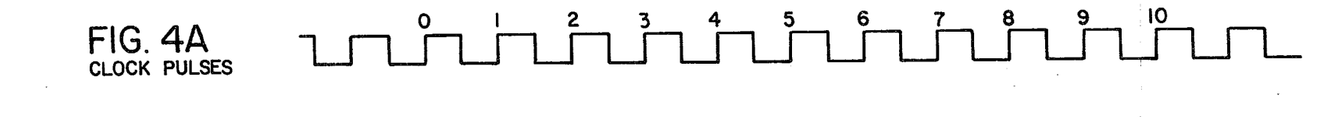
FIG. 4A through 4H are timing diagrams useful in understanding the operation of the control logic network shown in FIG. 3.
Figure 4B:
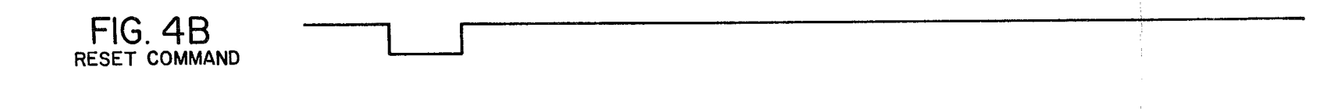
Figure 4C:
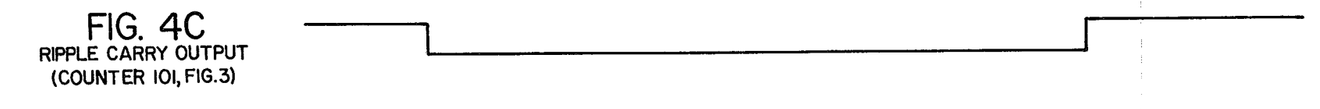
Figures 4D, 4E:
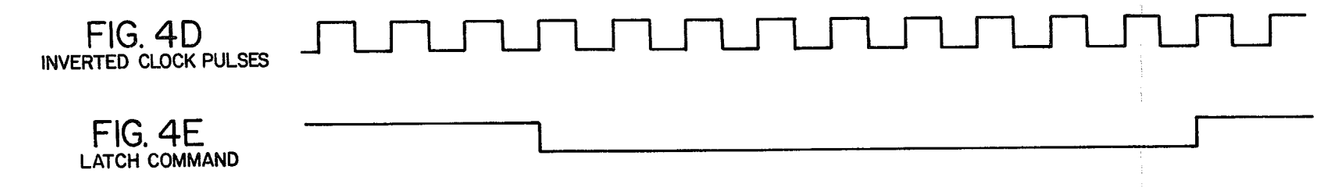
Figures 4F, 4G:
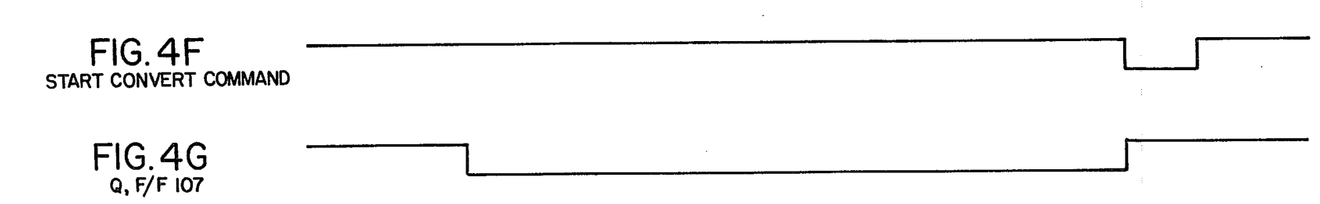
Figure 4H:
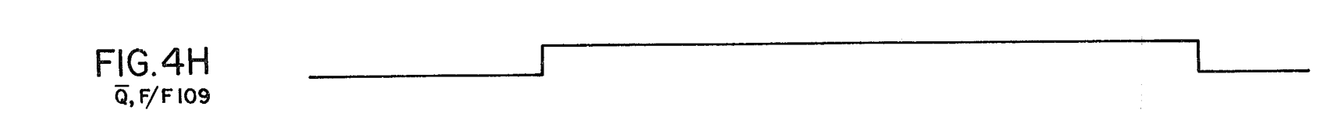

Referring now to FIG. 3 and to FIGS. 4A through 4H, the operation of the control logic network 83 of the receiver/processor interface unit 70 (FIG. 2B) will be explained. Thus, the control logic network 83 is shown to receive a RESET command (FIG. 4B) and a 6.1 MHz CLOCK signal (FIG. 4A) from the timing generator 29 (FIG. 1). The RESET command (FIG. 4B) which is used to trigger a counter 101, is synchronous with the MUX gate applied by the timing generator 29 (FIG. 1) to the I.F. multiplexer 63 (FIG. 2A). That is to say, the RESET commands are separated by approximately 5.2 microseconds which corresponds to the length of each of the time multiplexed pitch and yaw error signals along with sum and split-gate sum (range error) signals out of the I.F. multiplexer 63 (FIG. 2A). The RESET command (FIG. 4B) together with the rising edge of the next clock pulse, here clock pulse 0 (FIG. 4A), resets the counter 101 which is here a 4 bit device. This action causes the RIPPLE CARRY OUTPUT (FIG. 4C) of counter 101 to switch from a "logical 1" to a "logical 0". It is noted here in passing that the RIPPLE CARRY OUTPUT (FIG. 4C) of counter 101 switches from a "logical 0" to a "logical 1" whenever that device has completed its count of 9 clock pulses. Once having made the transition from a "logical 0" to a "logical 1" the RIPPLE CARRY OUTPUT (FIG. 4C) remains in that state for the duration of the 32 clock pulse period (corresponding to the 5.20 microsecond width of the various signals out of the I.F. multiplexer 63 (FIG. 2A)). To accomplish the foregoing the RIPPLE CARRY OUTPUT (FIG. 4C) is passed, via an inverter 105, to the ENABLE input terminal of the counter 101. The 6.1 MHz CLOCK PULSES (FIG. 4A) are inverted by an inverter 103 to produce INVERTED CLOCK PULSES (FIG. 4D) offset from the 6.1 MHz CLOCK (FIG. 4A) by the time delay of the inverter 103. Such INVERTED CLOCK PULSES are passed as clock signals to a pair of D-type flip/flops (F/F 107, 109), a counter 117 and a third D-type F/F 119. The noninverted (Q) output of F/F 109 is passed as a LATCH command (FIG. 4E) to a latching circuit 111. The LATCH command (FIG. 4E) is the RIPPLE CARRY OUTPUT (FIG. 4C) from counter 101 delayed by two INVERTED CLOCK pulses (FIG. 4D) by means of F/F 107 and F/F 109. The noninverted Q output of F/F 107 (FIG. 4G) and the inverted (Q̄) output of F/F 109 (FIG. 4H) are combined in a NAND gate 113 to provide a START CONVERT command (FIG. 4F) for the eight bit A/D converter 89 (FIG. 2B).

The data inputs to the latching circuit 111 are the outputs of the comparator network 85 (FIG. 2B) determined by the levels of the signals in the S/H 81b, 81c and 81d (FIG. 2B). Once latched, such data inputs are passed to a 4 line to 2 line priority encoder 115. The latter generates a 2 bit output corresponding to the first data input that is at the "logical 0" level. Since the comparator network 85 (FIG. 2B) data outputs (not numbered) are at the "logical 0" level when the corresponding video samples from the S/H 81b, 81c and 81d are within their "windows", the 4 line to 2 line priority encoder 115 will designate the most sensitive channel which has not exceeded its "window". It is noted here in passing that the fourth data input to the 4 line to 2 line priority encoder 115 is grounded, thereby providing for the default condition, mentioned hereinabove, wherein the least sensitive channel is designated in the event that the other three channels exceed their respective windows. The data output from the 4 line to 2 line priority encoder is passed to: (a) the FFT processor 21 (FIG. 1) as the two exponent bits and (b) a 2 line to 4 line decoder 117 whose output provides the control signals to the selector 87 (FIG. 2B) which, in turn, selects which of the outputs of the S/H 81a, 81b or 81d (FIG. 2B) will be passed to the eight bit A/D converter 89 (FIG. 2B). There is a delay of approximately 1.1 microseconds provided between the application of the multiplexing signals to the selector 87 (FIG. 2B) and the START CONVERT command (FIG. 4F) to the eight bit A/D converter 89 (FIG. 2B) to provide for the settling of any switching transients prior to the start of the A/D conversion.

Digressing now for a moment, in order to ensure that the correct channel is always designated by the control logic network 83, it is mandatory that the combination of the I.F. amplifier 71 (FIG. 2B) and the mixer 73b (FIG. 2B) in the amplifier channel with the highest gain does not reach its 1 dB compression point until the maximum input signal level of the other two amplifier channels is reached. Otherwise, the 18 dB gain difference between each pair of adjacent amplifier channels will not be preserved and the situation where a higher gain channel will have its effective (combined I.F. and video) gain reduced by the amount of compression will arise. In such a case, video samples taken in the vicinity of signal zero crossings may be incorrectly designated by the comparator network 85 (FIG. 2B) to the control logic network 83. It will be recognized that any possibility of error in designation could be eliminated by providing sufficient excesss dynamic range in the high gain I.F. channel equal to the gain difference between I.F. channels (here 36 dB). Practical hardware limitations preclude such an approach. Satisfactory operation has, however, been obtained by providing, in conjunction with encoding logic in the comparator network 85, a minimum of 18 dB of compression "head room". That is to say, the I.F. amplifier 71 and the mixer 73b are chosen such that their combined 1 dB compression point is not reached given a signal 18 dB greater than the full scale input level of the high gain I.F. channel. In the comparator network 85 (FIG. 2B) the outputs of the comparators (not shown) monitoring S/H 81b and 81c are combined in an OR gate (also not shown) such that the comparator (not shown monitoring S/H 81c (FIG. 2B) can never indicate a valid signal level ("logical 0" output) unless the comparator (not shown) monitoring S/H 81b (FIG. 2B) also indicates a valid "logical 0" signal level. This precludes the possibility of incorrectly designating S/H 81c (FIG. 2B) instead of S/H 81a (FIG. 2B) due to the effects of I.F. gain compression.

Completing the control logic network 83 are a counter 117, a D-type F/F 119 and an inverter 121 which are clocked by the INVERTED CLOCK signal (FIG. 4D) from the inverter 103. At the end of the A/D conversion process, which takes 9 clock cycles or 1.5 microseconds to complete, the A/D converter 89 (FIG. 2B) sends an END OF CONVERSION signal to the counter 117. The operation of the counter 117, D-type F/F 119 and inverter 121 is identical to that of counter 101, D-type F/F 107 and inverter 105 and will not be described here. Suffice it to say that the output signal from the D-type F/F 119 is applied, via a buffer (not shown), as a control signal to S/H 81a, 81b, 81c and 81d (FIG. 2B). The latter are commanded to HOLD when such control signal is a "logical 0" and to SAMPLE when the control signal is a "logical 1". There is a 600 nanosecond settling time provided between the occurrence of the HOLD command and the time that the data from the comparator network 85 are latched.

Referring back now for a moment to FIGS. 2A and 2B, the composite timing of the receiver/processor interface unit 70 will be explained. Thus, the pitch and yaw error signals together with the sum and split-gate sum signals are here time multiplexed out of the I.F. multiplexer 63 at a 192 KHz rate, and, therefore, each of the aforementioned signals has a pulse width of 5.2 microseconds (μs). Approximately 3.0 μs after the signals begin to be time multiplexed out of the I.F. multiplexer 63 the control logic network 83 commands the S/H 81a, 81b, 81c and 81d to sample the video signals, thereby providing a 3.0 μs period for the settling of switching transients. The sample period is 1.8 μs in duration and is followed by a 600 ns hold settling period. Upon completion of the sample/hold period the control logic network 83, in conjunction with the comparator network 85, performs the window comparison, exponent selection and switching of the selector 87 (FIG. 2B). After allowing approximately 1.1 μs for switching transients to die out, the A/D converter 89 digitizes the selected sample. The A/D conversion process is 1.5 μs in duration.

The herein contemplated receiver/processor interface unit 70 linearly preserves all spectral information existing at the outputs of the roughing filters 61a, 61b, 61c and 61d and permits more optimum and sophisticated signal processing in the digital domain. Thus, for example, a relatively high magnitude fast blinking jammer can readily be recognized and digitally blanked to enhance the signal-to-jammer ratio if desired, or the strong jammer signals can be separately time domain processed within the FFT processor 21 (FIG. 1). Furthermore, multiple targets or target and turbine lines will not be crossmodulated thereby providing target resolution equal to the FFT Doppler filter spacing.

Having described a preferred embodiment of this invention, it will now be apparent to one of skill in the art that changes may be made without departing from the concept that a wide dynamic range may be provided in a receiver without requiring a conventional AGC arrangement. For example, the number of amplifier channels may be changed, with a concomitant change in the dynamic range of each such channel, or the dynamic range of each amplifier channel may be changed. It is felt, therefore, that this invention should not be restricted to its preferred embodiment but rather should be limited only by the spirit and scope of the appended claims.

What is claimed is:

1. In a radar receiver wherein received signals having amplitudes which may vary within a wide range of possible amplitudes are processed, an improved intermediate frequency and video frequency amplifier arrangement having a dynamic range corresponding to the range of possible amplitudes of the received signals, such arrangement comprising:
   (a) a plurality of amplifier channels, each one thereof having a linear response to received signals within a different portion of the range of possible amplitudes and being responsive to each received signal to produce a video signal out of each one of such channels;
   (b) means, responsive partially to the video signals out of the plurality of amplifier channels, for producing a selector signal indicative of the particular one of the plurality of amplifier channels containing the largest video signal linearly related to the received signal; and
   (c) means, responsive to the selector signal and to the video signal out of the particular one of the plurality of amplifier channels, for selecting such video signal for further processing.

2. The improved intermediate frequency and video frequency amplifier arrangement as in claim 1 wherein the plurality of amplifier channels comprises, at least:

(a) a first intermediate frequency amplifier and a second intermediate frequency amplifier having the same phase shift characteristics and different gain characteristics;
(b) means for converting intermediate frequency signals out of the first and the second intermediate frequency amplifiers to video signals; and
(c) a first and a second video amplifier responsive respectively to the video signals to produce at least one video signal having an amplitude linearly related to the received signal.

3. The improved intermediate frequency and video frequency amplifier arrangement as in claim 2 wherein the linear portions of the dynamic ranges of the first and the second amplifier channels overlap one another.

4. The improved intermediate frequency and video frequency arrangement as in claim 3 wherein the means for producing the selector signal comprises means for producing a digital signal representative of the selected one of the amplifier channels.

5. The improved intermediate frequency and video frequency arrangement as in claim 4 comprising, additionally, means for converting the selected video signal to a digital form.

* * * * *